(12) United States Patent
Sciaini et al.

(10) Patent No.: US 12,272,517 B2
(45) Date of Patent: Apr. 8, 2025

(54) NANOFLUIDIC CARRIER

(71) Applicants: Germán Sciaini, Waterloo (CA); Ariel Petruk, Waterloo (CA)

(72) Inventors: Germán Sciaini, Waterloo (CA); Ariel Petruk, Waterloo (CA)

(*) Notice: Subject to any disclaimer, the term of this patent is extended or adjusted under 35 U.S.C. 154(b) by 383 days.

(21) Appl. No.: 17/546,845

(22) Filed: Dec. 9, 2021

(65) Prior Publication Data

US 2022/0102107 A1 Mar. 31, 2022

Related U.S. Application Data

(63) Continuation-in-part of application No. 17/428,876, filed as application No. PCT/CA2020/050144 on Feb. 2, 2020.

(60) Provisional application No. 63/205,438, filed on Dec. 11, 2020, provisional application No. 62/801,327, filed on Feb. 5, 2019.

(51) Int. Cl.
*H01J 37/20* (2006.01)

(52) U.S. Cl.
CPC .................................. *H01J 37/20* (2013.01)

(58) Field of Classification Search
CPC ................... H01J 37/20; H01J 2237/20; H01J 2237/2002; H01J 2237/2003; H01J 2237/2004
See application file for complete search history.

(56) References Cited

U.S. PATENT DOCUMENTS

| 9,778,151 B2 * | 10/2017 | Chang ..................... H01J 37/20 |
| 2010/0193398 A1 * | 8/2010 | Marsh ..................... H01J 37/20 |
| | | 29/428 |
| 2012/0182548 A1 * | 7/2012 | Harb ..................... G01N 21/05 |
| | | 156/182 |
| 2017/0062177 A1 * | 3/2017 | Walden, II ....... G01N 23/20033 |
| 2017/0176298 A1 * | 6/2017 | Chang ............... B01L 3/502715 |

FOREIGN PATENT DOCUMENTS

CN         106324000 A  *  1/2017  ............. G01N 23/04

* cited by examiner

*Primary Examiner* — David E Smith
(74) *Attorney, Agent, or Firm* — Smart & Biggar LP

(57) ABSTRACT

Parts of a pair, in use, are disposed in abutting relation to one another to define a cell for use with an electron microscope, the cell having, disposed on opposite surfaces thereof, a pair of windows, the windows being arranged in spaced relation to one another to define a viewable interior volume of the cell at a region of overlap. The spaced relation being determined by additional opposite surfaces with minimal contact area to warrant reproducible liquid thicknesses.

18 Claims, 12 Drawing Sheets

NANOFLUIDIC CARRIER

CROSS-REFERENCE TO RELATED APPLICATIONS

This application is a continuation-in-part of U.S. patent application Ser. No. 17/428,876, filed Aug. 5, 2021, which is incorporated by reference herein in its entirety, which application is a national stage application filed under 35 U.S.C. 371 of International Patent Application No. PCT/CA2020/050144, filed Feb. 2, 2020, which is also incorporated by reference herein in its entirety and which claims the benefit of U.S. Provisional Patent Application Ser. No. 62/801,327, filed Feb. 5, 2019. This application further claims the benefit of U.S. Provisional Patent Application 63/205,438 filed Dec. 11, 2020, which is also incorporated by reference herein in its entirety.

FIELD

The invention relates to the field of electron microscopy.

BACKGROUND

It is well known to study in-liquid samples using a nanofluidic cell placed within an electron microscope, but known methods suffer from, inter alia, poor reproducibility.

SUMMARY OF THE INVENTION

Forming one aspect of the invention is apparatus for use with an electron microscope and for receiving a liquid sample and/or an in-liquid sample droplet. The apparatus comprises: a pair of parts which, in use, are disposed in abutting relation to one another to define a cell for use with said microscope, the cell having: disposed on opposite surfaces thereof, a pair of windows, the windows being arranged in spaced relation to one another; to define: a viewable interior volume of the cell at a region of overlap and the height of a cavity; the cavity communicating with the viewable interior volume of the cell, the volume of the cavity, in combination with the viewable interior volume, being larger than the volume of the droplet, the spaced relation being determined by additional opposite surfaces with minimal contact area between them.

According to another aspect of the invention, each part of the pair can be defined, at least in part, by a respective body.

According to another aspect of the invention, each body defines a surface in which the window of each body is defined.

According to another aspect of the invention, the surface in which the window is defined can be one or more of the end of a boss and a surface having a high affinity for the liquid.

According to another aspect of the invention, each body defines an additional surface in which the height of the cavity of such body is defined.

According to another aspect of the invention, the surface in which the height of the cavity of such body is defined can be one or more of the end of a boss with minimal contact area.

According to another aspect of the invention, the pair of parts can further comprise a compressible seal, the seal: being disposed between the bodies and in compression in the cell; and defining, in part, the cavity.

According to another aspect of the invention, the seal can be an O-ring.

According to another aspect of the invention, the pair of parts can further comprise a coating disposed on one or both of the bodies and sealing the bodies together to seal the cavity in use.

According to another aspect of the invention, each of the bodies can terminate in a flat surface, the flat surfaces abutting one another in use to define a seal which seals the cavity in use.

According to another aspect of the invention, each body can be a silicon body.

According to another aspect of the invention, each window can be a high electron transparent window.

According to another aspect of the invention, any boss can terminate in and not limited to a slit shaped surface with minimal area.

Advantages, features and characteristics of the invention will become apparent upon a review of the following detailed description with reference to the appended drawings, the latter being briefly described hereinafter.

DETAILED DESCRIPTION

Figure 1:
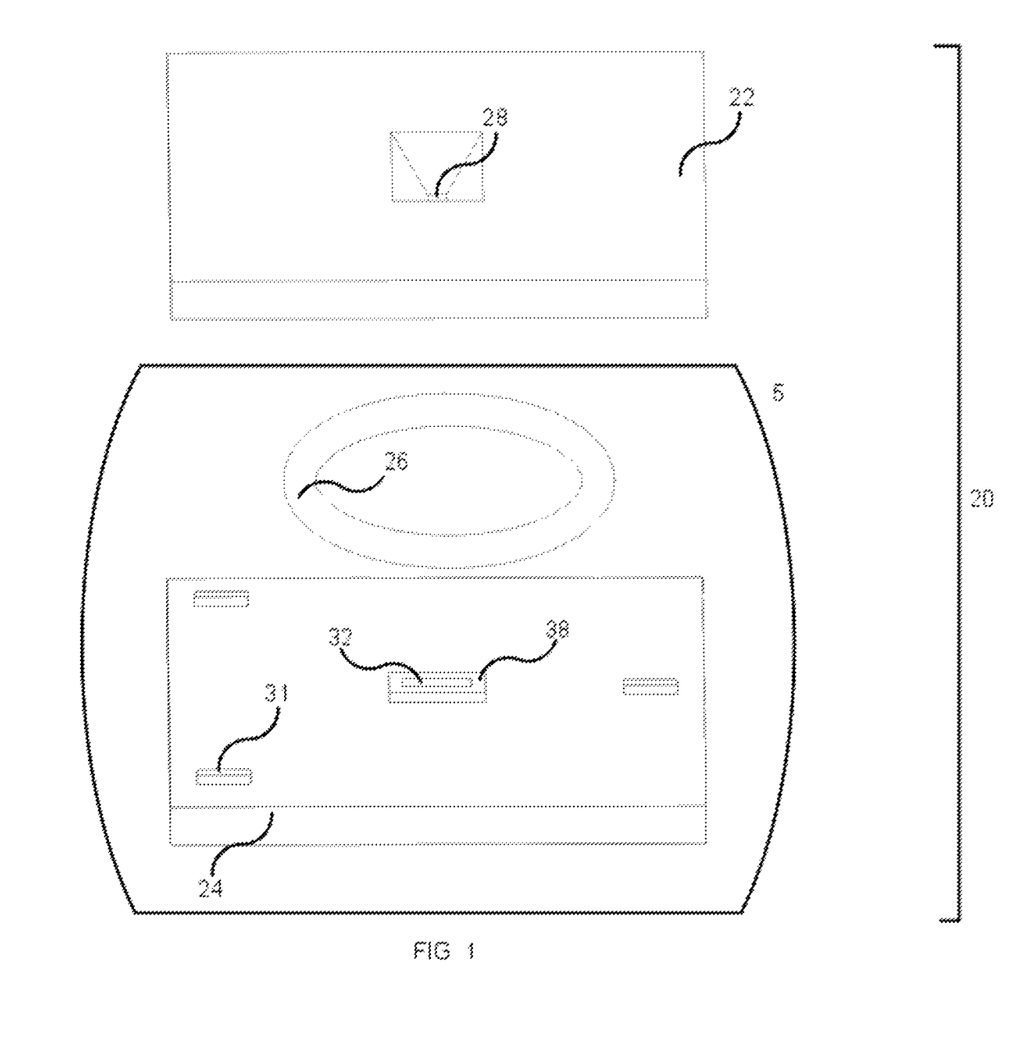
FIG. 1 is a view of an exemplary embodiment of the inventive apparatus for use with an electron microscope and for receiving a sample.
Figure 2:
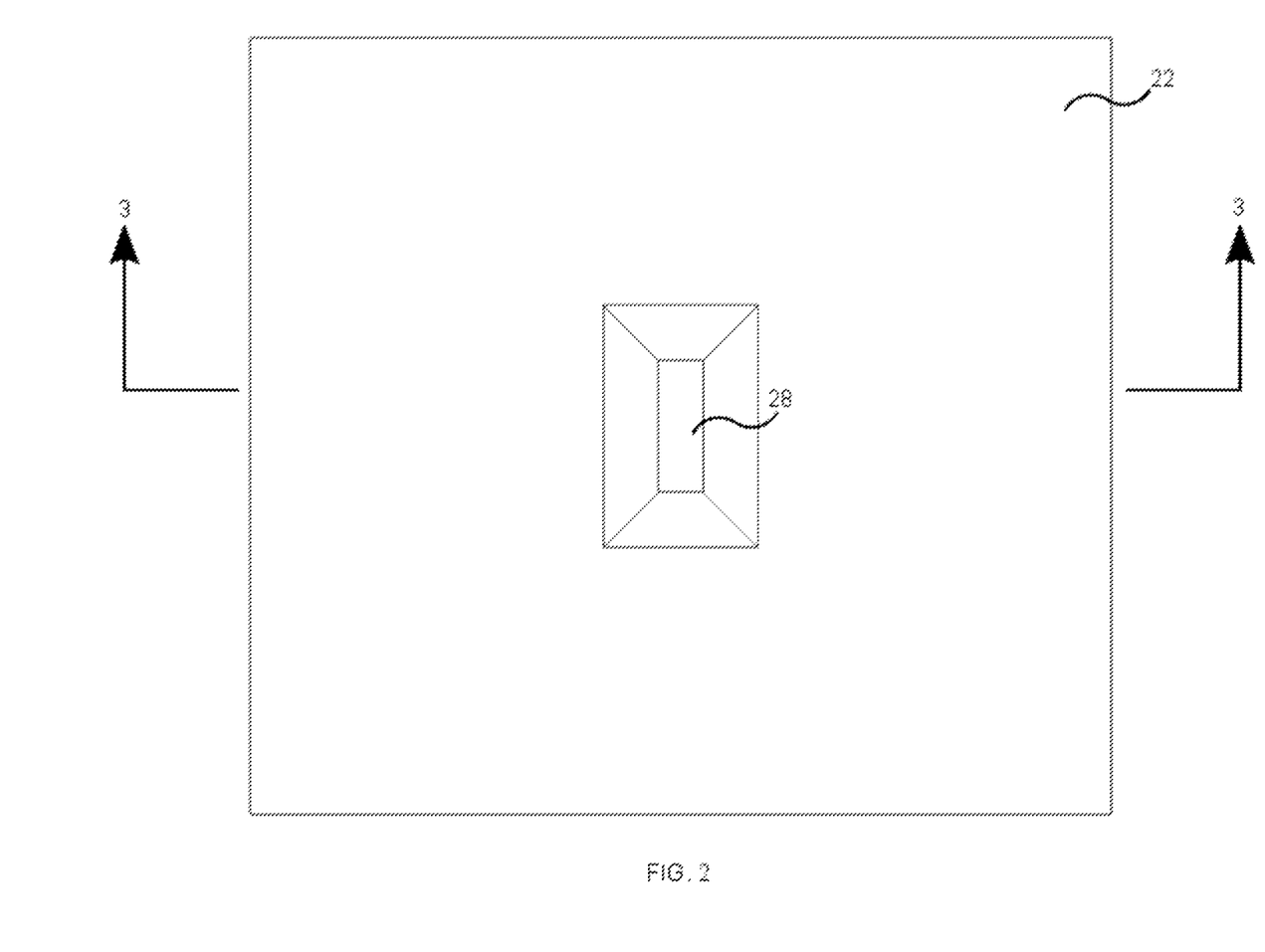
FIG. 2 is a top view, similar to FIG. 1.
Figure 3:
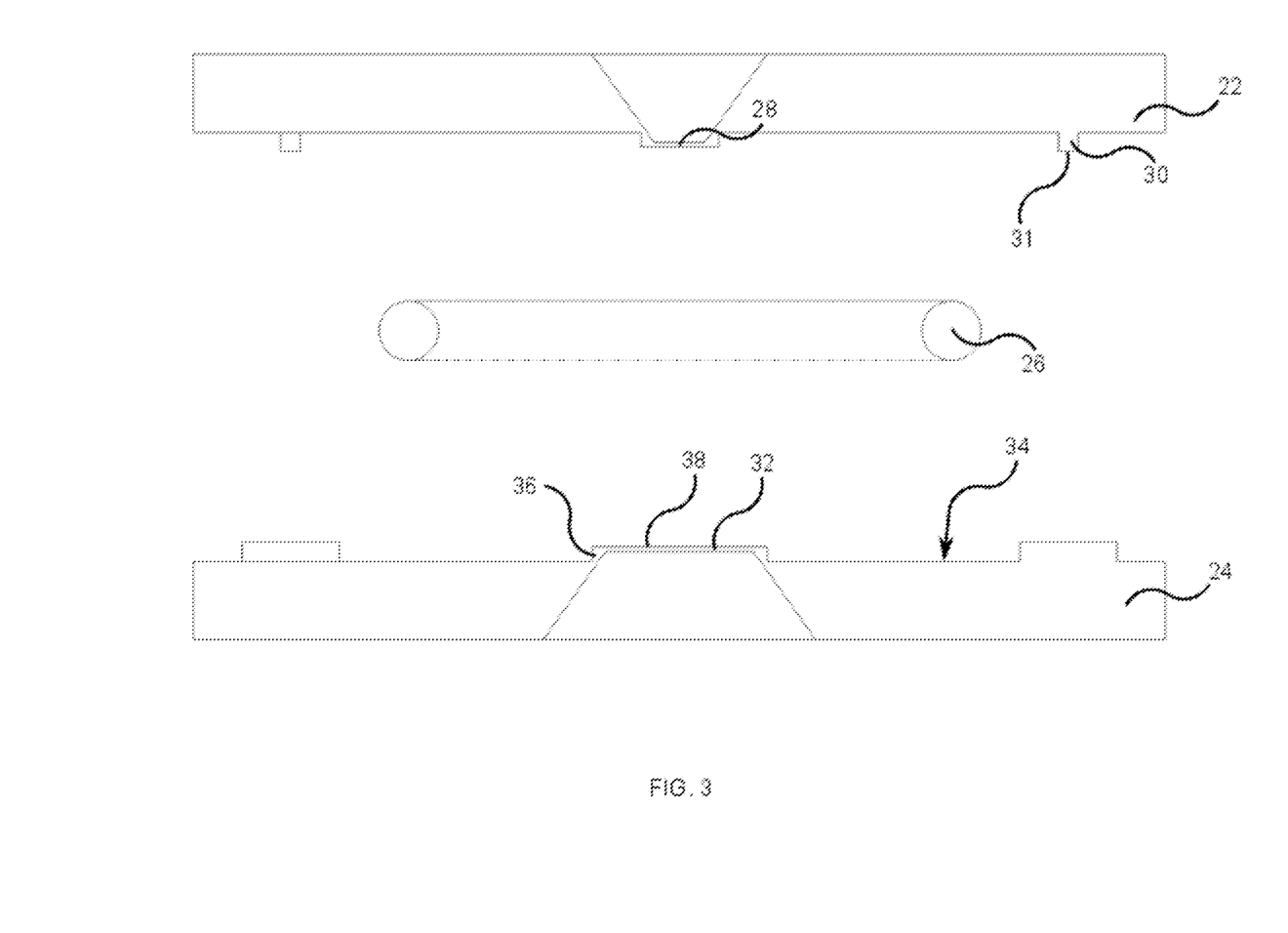
FIG. 3 is a view along 3-3 of FIG. 2.
Figure 4:
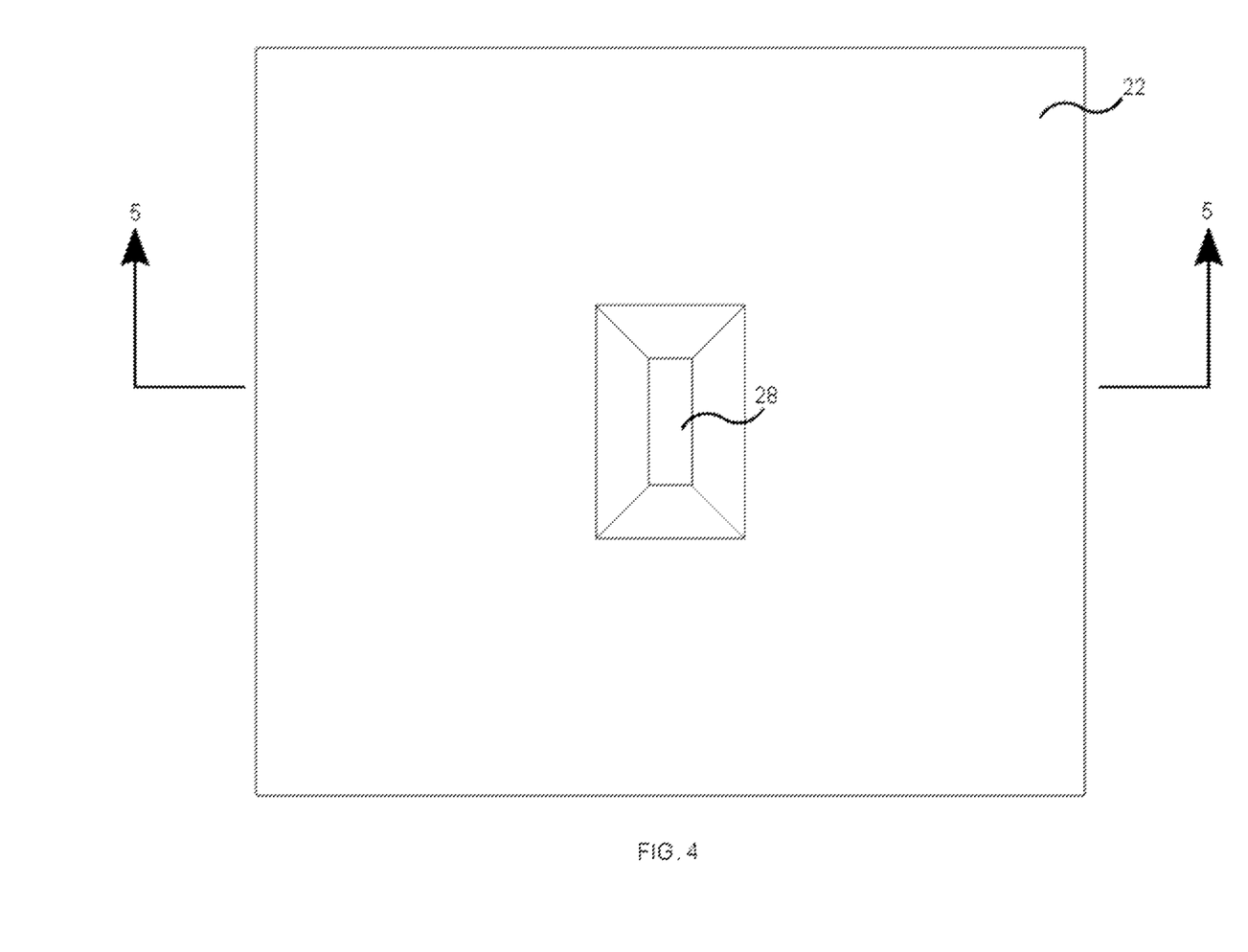
FIG. 4 is a top view of the structure of FIG. 1, with the structure of encircled area 5 of FIG. 1 assembled for use.

With reference to FIGS. 1-3, this apparatus 20 comprises a pair of silicon bodies 22, 24 and a seal 26.

Bodies 22 and 24 define a slit-shaped high electron transparent window 28, a recess 34, a boss 36 extending from the recess and terminating in a surface 38 in which the window 28 is defined, and a plurality of bosses 30 extending from the recess 34 and terminating in a surface 31, beyond surface 38, to define the height of the cavity.

Figure 5:
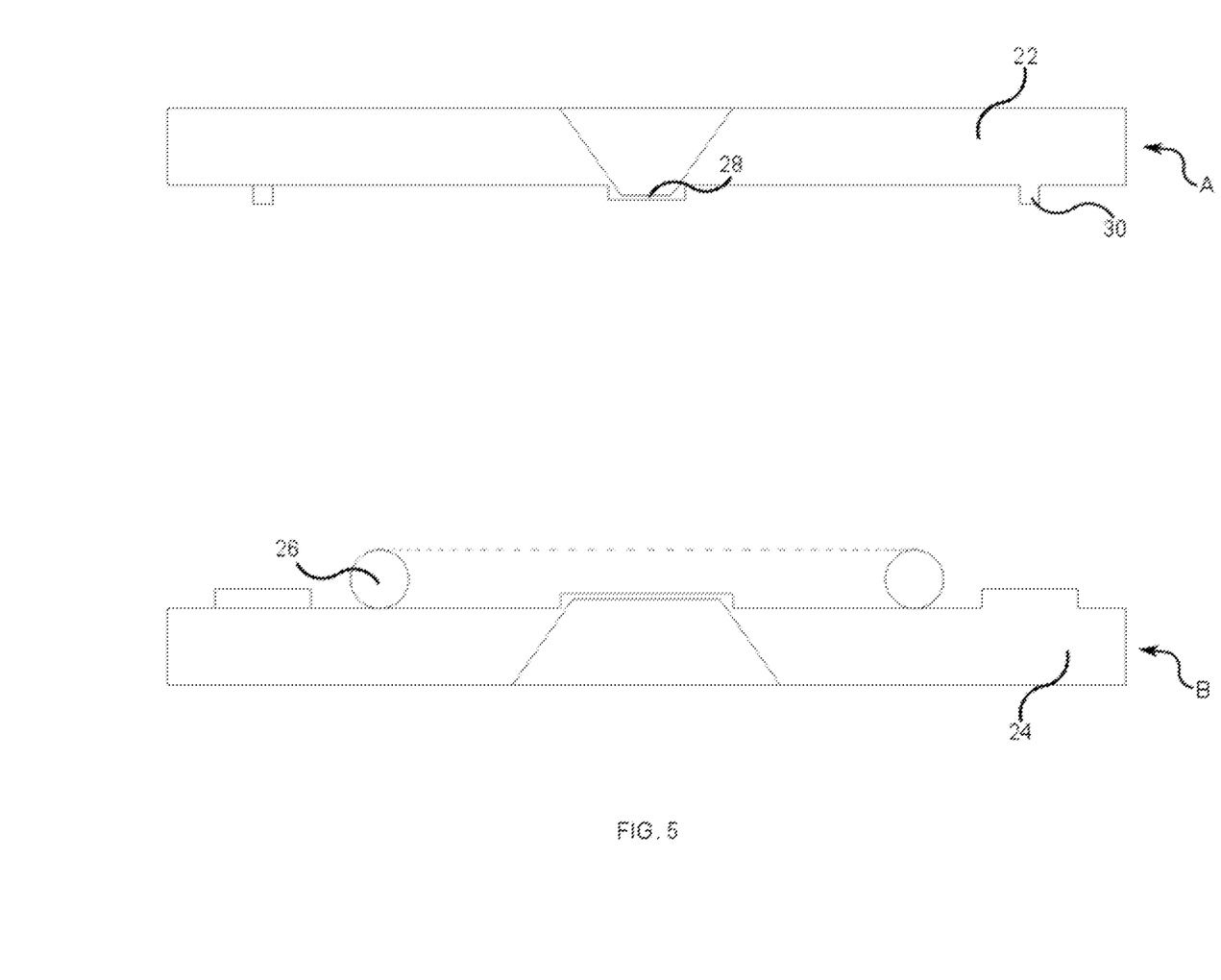
FIG. 5 is a view along 5-5 of FIG. 4.
Figure 6:
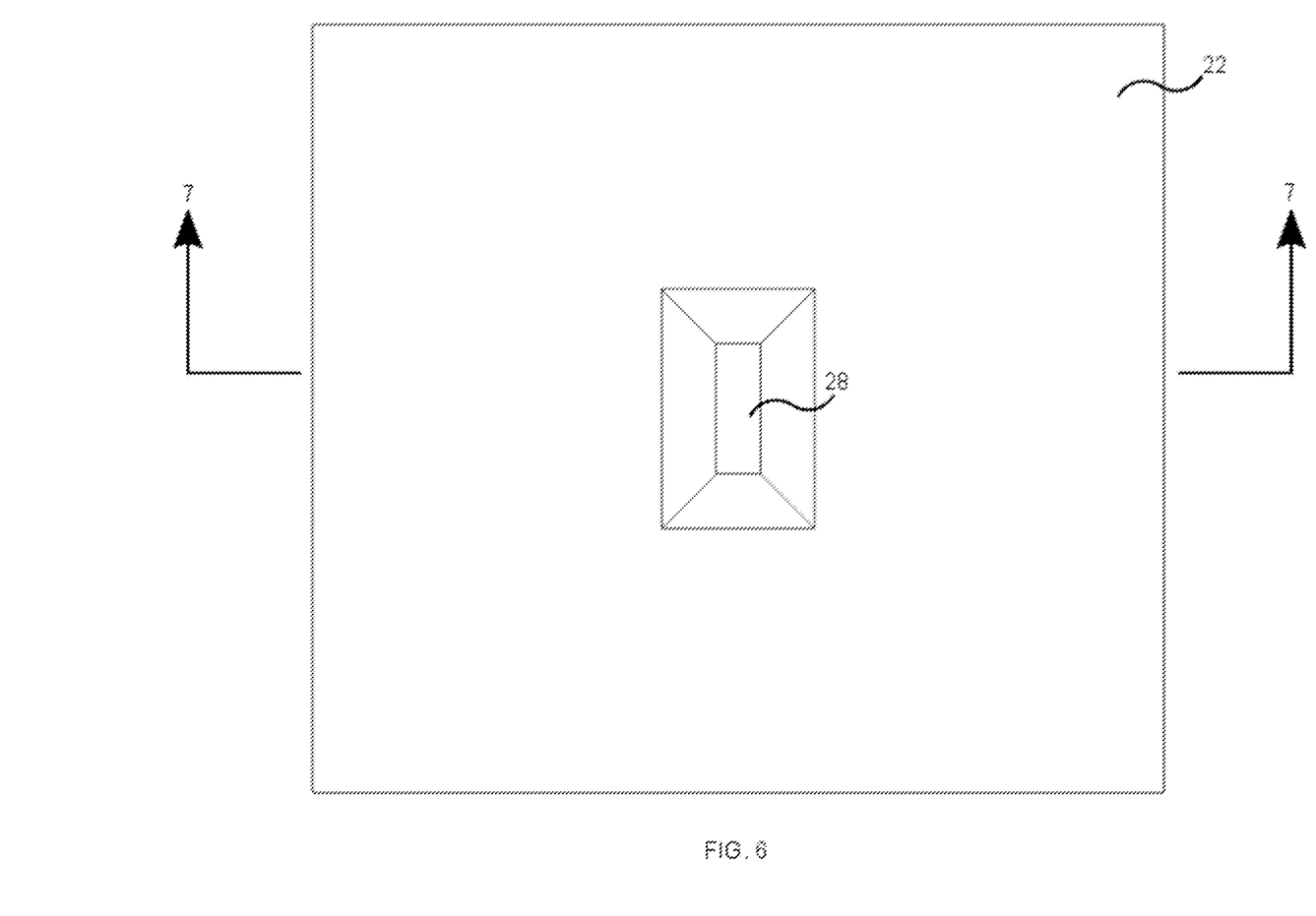
FIG. 6 is a top view of the structure of FIG. 4 in receipt of a droplet.

The seal 26 is an O-ring that is sized and dimensioned, when positioned in the recess as shown in FIG. 5; wherein it will be seen that the bodies and seal define a pair of parts A, B, which define a cell for use with said microscope.

Figure 7:
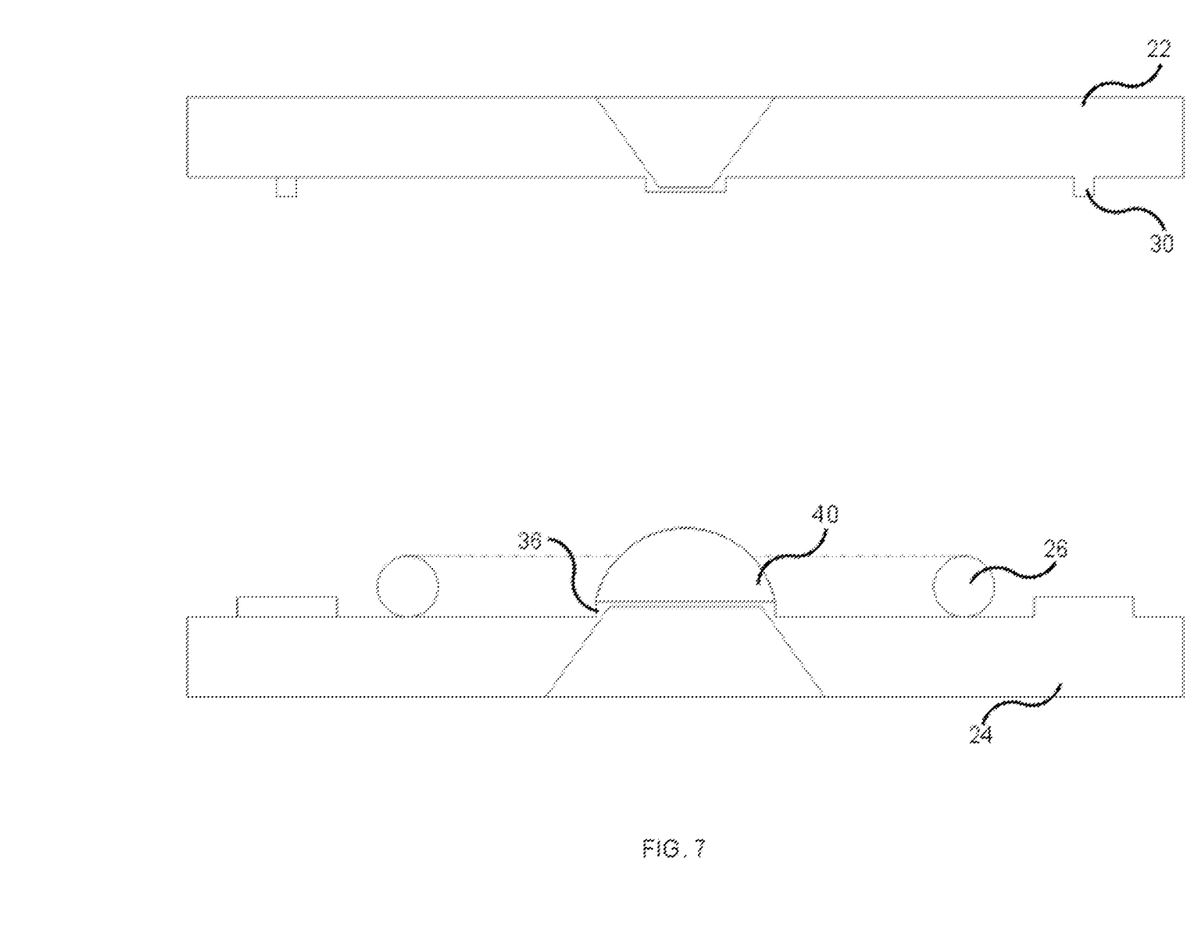
FIG. 7 is a view along 7-7 of FIG. 6.
Figure 8:
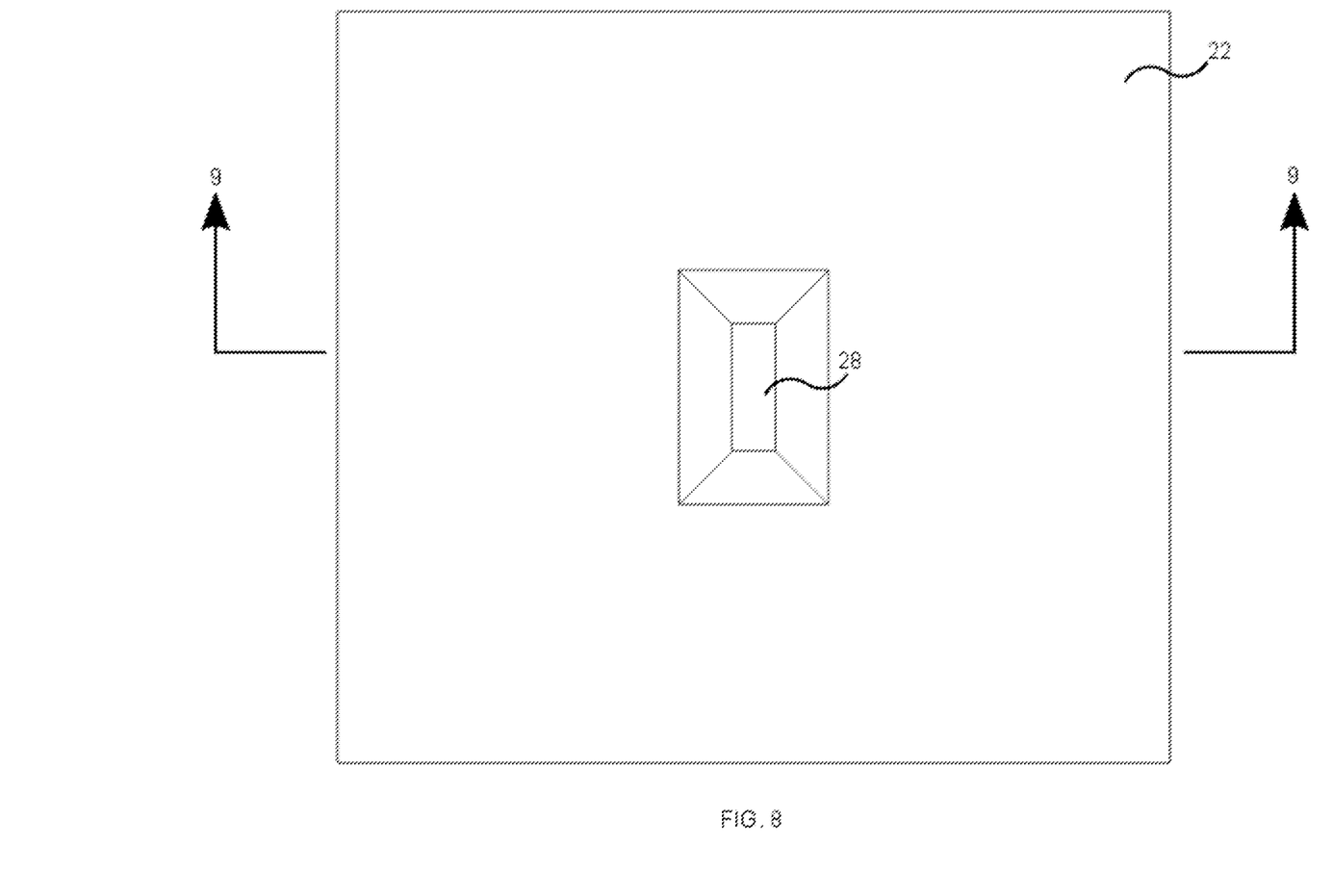
FIG. 8 is a top view of the structure of FIG. 6 assembled for use.
Figure 9:
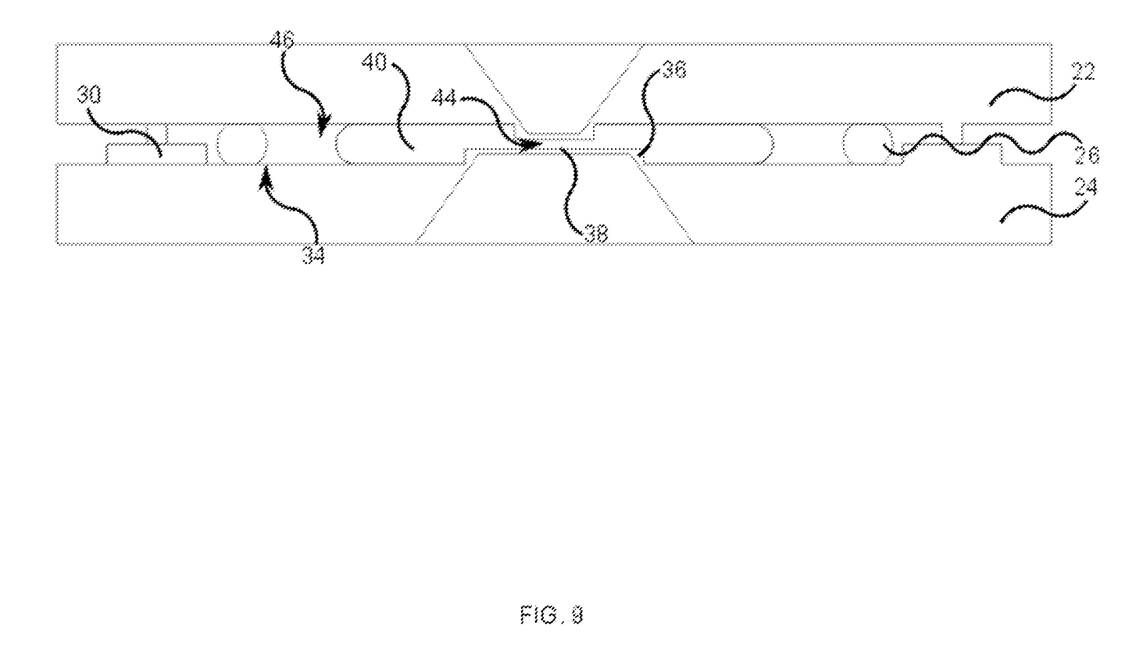
FIG. 9 is a view along 9-9 of FIG. 8.

In use, a droplet 40 of liquid is placed upon the boss 36, as shown in FIG. 7, and thereafter, the one of the bodies is placed upon the other of the bodies, as shown in FIG. 9.

The cell has, disposed on opposite surfaces thereof, the pair of slit-shaped windows, the windows being arranged in perpendicular and spaced relation to one another to define a viewable interior volume 44 of the cell at the region of overlap.

The cell further has a cavity 46, defined by the seal and the bodies, communicating with the viewable interior volume of the cell, the volume of the cavity, in combination with the viewable interior volume, being larger than the volume of the droplet, wherein the height of the cavity is defined by the bosses 30.

Persons of ordinary skill will readily appreciate that this structure has significant advantage in that it allows for, inter alia, the production of nano-fluidic cells having a reliable liquid viewing depth [the distance between the windows] notwithstanding that a delivery device having a relatively low precision may be used for deposition of the fluid.

Advantages

By minimizing the contact area between body 22 and body 24, high reproducible cavity height and liquid layer thicknesses are attained.

Variations

Whereas a single embodiment of each of the cell is described, persons of ordinary skill will appreciate that variations are possible.

For example, materials other than silicon can be employed for the bodies.

Moreover, the material of high electron transparent window is not limited to stoichiometric silicon nitride, non-stoichiometric silicon nitride, titanium nitride, silicon oxide, aluminum oxide, boron nitride, carbon, indium tin oxide, aluminum, titanium, chromium, etc.

Further, windows with a plurality of materials may be used to optimize nanofluidic cell performance. As well, when larger viewing areas are required, a plurality of windows may be provided.

Windows do not need to be slit shaped and could take any shape.

Windows do not need to be arranged in perpendicular orientation.

As well, various techniques can be used to produce the cavity, including but not limited to reactive ion etching, wet etching, sand blasting, etc. The recess can also be formed on either or both of the bodies.

It should also be appreciated that the invention is not restricted to the use of a single O-ring as sealant; other kinds of sealants may be used (e.g. gold, indium, titanium, chromium, low melting point alloys, epoxy, glue, gasket, etc.).

Figure 10:
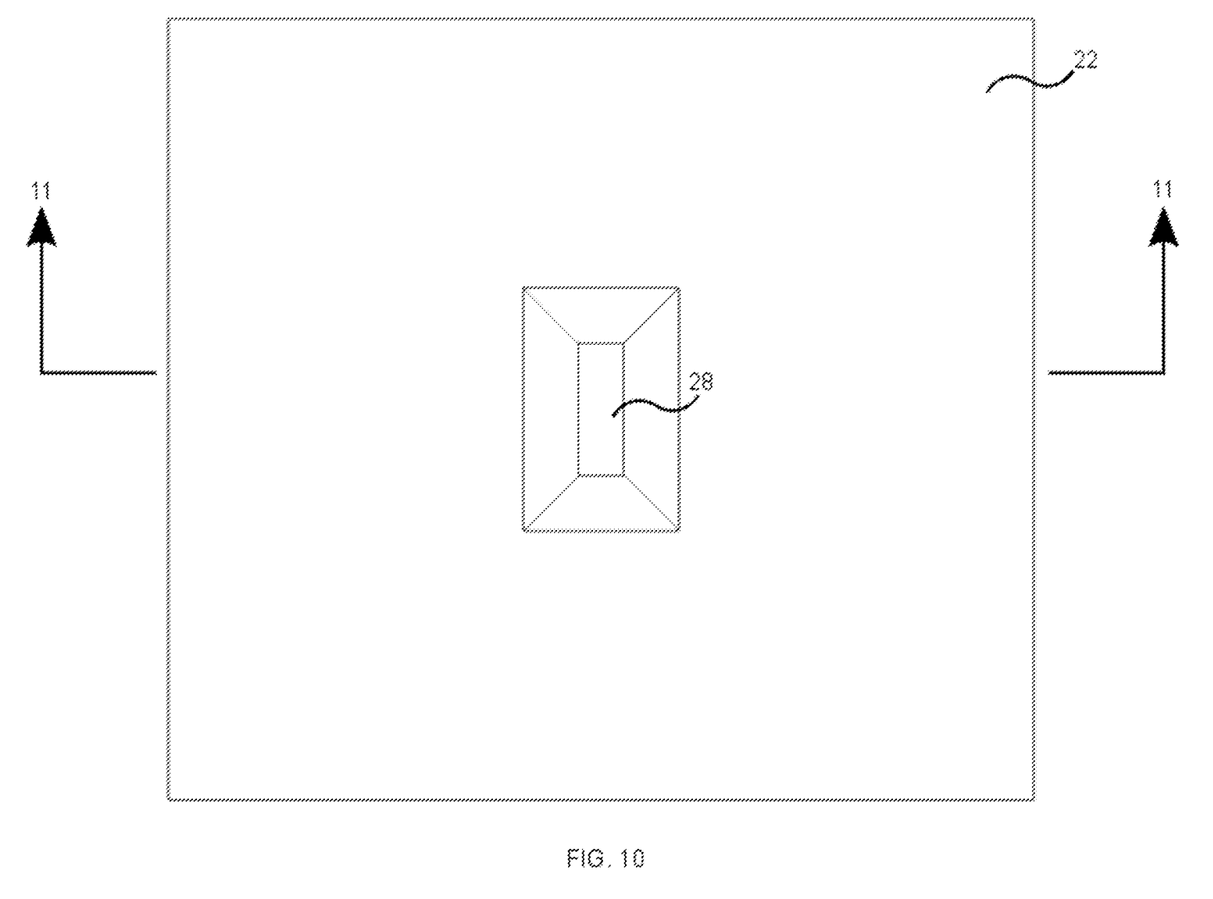
FIG. 10 is a top view, similar to FIG. 8, of an alternate embodiment of the apparatus of FIG. 1.
Figure 11:
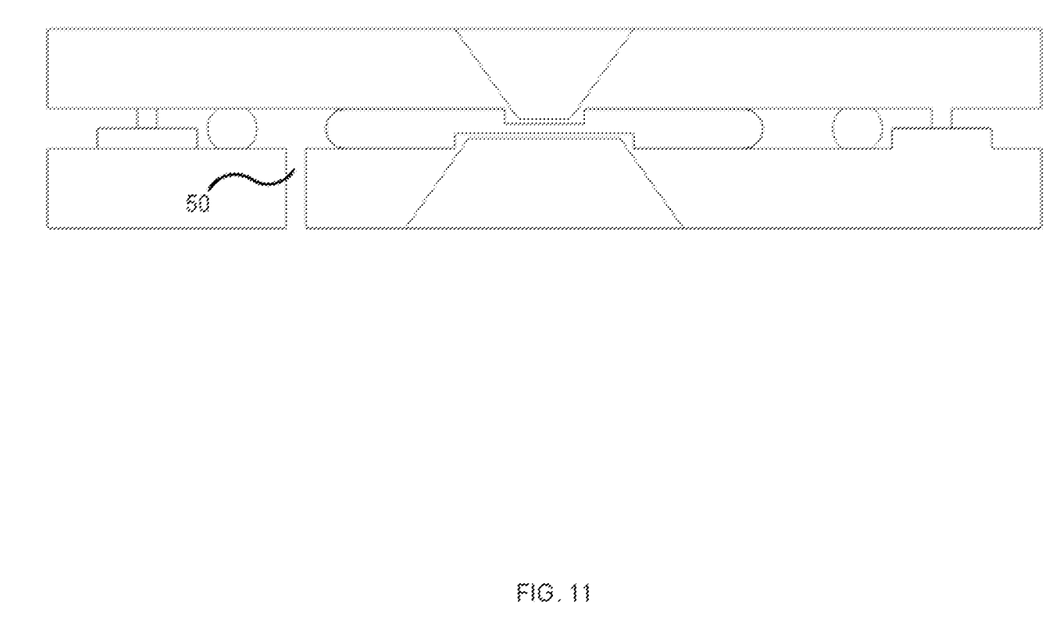
FIG. 11 is a view along 11-11 of FIG. 10.

With the addition of at least one opening 50 connecting the inner volume of the cell with the outside, the inner cell pressure could be modified after closing the cell (FIGS. 10 and 11).

Figure 12:
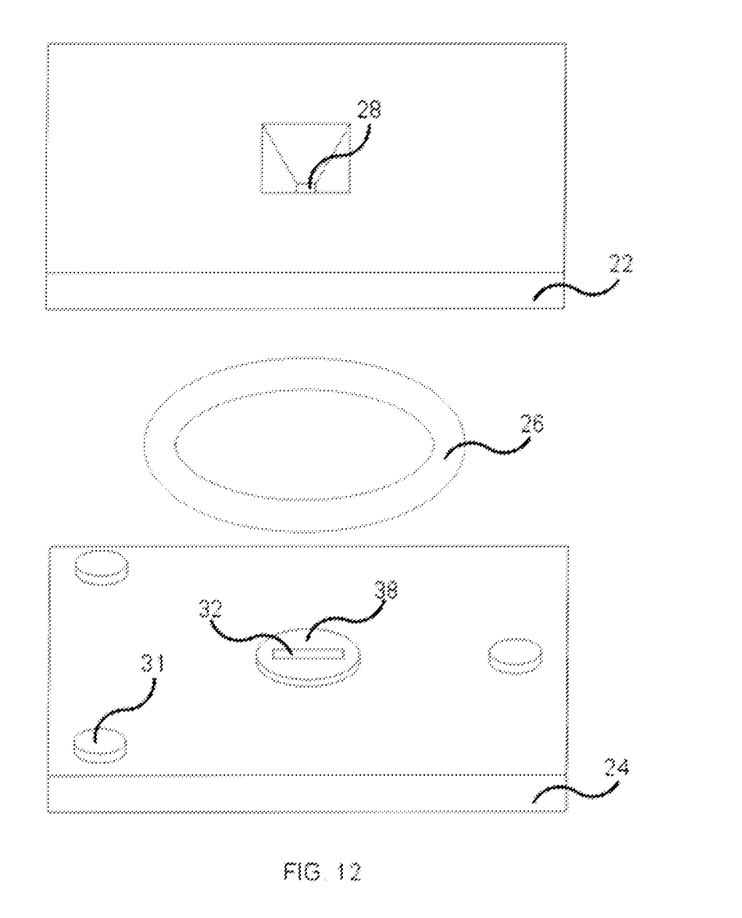
FIG. 12 is a view, similar to FIG. 1, of an alternate embodiment of the apparatus of FIG. 1.

Bosses do not need to be split shaped and could take any shape (FIG. 12).

Bosses 30 and 36 can also be formed on either or both of the bodies.

Although FIGS. 1-9 show a single recess 34 in body 22 and body 24, a plurality of recesses could be present on either or both of the bodies.

Although FIGS. 1-12 show square body 22 and body 24, they could be any shape, and body 22 and body 24 do not need to have the same shape.

Electrical connections may be added to this invention for heating, electrochemistry, etc.

Yet further variations are possible. For example, only, whereas a droplet is occasionally mentioned, the sample could be of a liquid that does not form classical droplets. As well, whereas liquid is mentioned, it will be appreciated that the liquid could be a carrier for an in-liquid sample; the liquid need not itself be the sample.

The outer shape of the bodies 22 and 24 may differ from what is shown in FIGS. 1-9 to accommodate in different receivers.

A person of ordinary skills will notice that this nanofluidic device at the time of use can be contained in a receiver and secured with lead; being these made of the same or different materials such as and not limited to metals, plastics, rubbers, etc.

Accordingly, the invention should be understood to be limited only by the accompanying claims, purposively construed.

The invention claimed is:

1. Apparatus for use with an electron microscope and for receiving a liquid sample and/or in-liquid sample droplet, the apparatus comprising:
    a pair of parts which, in use, are disposed in abutting relation to one another to define a cell for use with said microscope, the cell having: disposed on opposite surfaces thereof, a pair of windows, the windows being arranged in spaced relation to one another; to define: a viewable interior volume of the cell at the region of overlap and the height of a cavity; the cavity communicating with the viewable interior volume of the cell; the volume of the cavity, in combination with the viewable interior volume, being larger than the volume of the droplet, the spaced relation being determined by additional opposite surfaces with contact area between them less than or equal to 0.1 mm$^2$
    wherein each of the bodies defines a surface in which the window of each body is defined; and
    wherein at least one of the bodies defines a surface in which the height of the cavity of such body is defined.

2. Apparatus according to claim 1, wherein each of the bodies defines a surface in which the window of each body is defined.

3. Apparatus according to claim 2, wherein the surface is one or more of the end of a boss and a surface having a high affinity for the liquid sample and/or the in-liquid sample droplet.

4. Apparatus according to claim 1, wherein the surface is one or more of the end of a boss with minimal contact area.

5. Apparatus according to claim 1, wherein the pair of parts further comprises a compressible seal, the seal: being disposed between the bodies and in compression in the cell; and defining, in part, the cavity.

6. Apparatus according to claim 5, wherein the seal is an O-ring.

7. Apparatus according to claim 2, wherein the pair of parts further comprises a coating disposed on one or both of the bodies and sealing the bodies together to seal the cavity in use.

8. Apparatus according to claim 2, wherein each body is a silicon body.

9. Apparatus according to claim 1, wherein each window is a high electron transparent window.

10. Apparatus for use with an electron microscope and for receiving a liquid sample and/or in-liquid sample droplet, the apparatus comprising:
    a pair of parts which, in use, are disposed in abutting relation to one another to define a cell for use with said microscope, the cell having: disposed on opposite surfaces thereof, a pair of windows, the windows being arranged in spaced relation to one another; to define: a viewable interior volume of the cell at the region of overlap and the height of a cavity; the cavity communicating with the viewable interior volume of the cell; the volume of the cavity, in combination with the viewable interior volume, being larger than the volume of the droplet, the spaced relation being determined by additional opposite surfaces with contact area between them less than or equal to 0.1 mm$^2$, wherein each of the bodies defines a surface in which the window of each body is defined; and wherein each of the bodies terminates in a flat surface, the flat surfaces abutting one another in use to define a seal which seals the cavity in use.

11. Apparatus for use with an electron microscope and for receiving a liquid sample and/or in-liquid sample droplet, the apparatus comprising:

a pair of parts which, in use, are disposed in abutting relation to one another to define a cell for use with said microscope, the cell having: disposed on opposite surfaces thereof, a pair of windows, the windows being arranged in spaced relation to one another to define a viewable interior volume of the cell at the region of overlap; and a cavity communicating with the viewable interior volume of the cell, the volume of the cavity, in combination with the viewable interior volume, being larger than the volume of the droplet wherein each part of the pair is defined, at least in part, by a respective body, each body defining a respective one of the windows; and wherein each of the bodies terminates in a flat surface, the flat surfaces abutting one another in use to define a seal which seals the cavity in use.

12. Apparatus according to claim 11, wherein one of the bodies defines a surface in which the window of such body is defined.

13. Apparatus according to claim 12, wherein the surface is one or more of the end of a boss and a surface having a high affinity for the liquid sample and/or the in-liquid sample droplet.

14. Apparatus according to claim 11, wherein the pair of parts further comprises a compressible seal, the seal: being disposed between the bodies and in compression in the cell; and defining, in part, the cavity.

15. Apparatus according to claim 14, wherein the seal is an O-ring.

16. Apparatus according to claim 11, wherein the pair of parts further comprises a coating disposed on one or both of the bodies and sealing the bodies together to seal the cavity in use.

17. Apparatus according to claim 11, wherein each body is a silicon body.

18. Apparatus according to claim 11, wherein each window is a high electron transparent window.

* * * * *